US008963366B2

(12) United States Patent
Zeng et al.

(10) Patent No.: US 8,963,366 B2
(45) Date of Patent: Feb. 24, 2015

(54) SYSTEM FOR POWER TRANSMISSION

(75) Inventors: Hua Zeng, Novi, MI (US); Masayoshi Takahashi, West Bloomfield, MI (US)

(73) Assignee: Hitachi, Ltd., Tokyo (JP)

( * ) Notice: Subject to any disclaimer, the term of this patent is extended or adjusted under 35 U.S.C. 154(b) by 639 days.

(21) Appl. No.: 13/252,306

(22) Filed: Oct. 4, 2011

(65) Prior Publication Data

US 2013/0082522 A1    Apr. 4, 2013

(51) Int. Cl.
*H05K 7/00* (2006.01)
*B60L 1/00* (2006.01)
*H02G 3/00* (2006.01)
*B60L 3/00* (2006.01)
*B60L 15/00* (2006.01)

(52) U.S. Cl.
CPC *B60L 3/003* (2013.01); *H02G 3/00* (2013.01); *B60L 1/00* (2013.01); *H05K 7/00* (2013.01); *B60L 3/0046* (2013.01); *B60L 15/007* (2013.01); *B60L 2270/147* (2013.01)
USPC .......................................... 307/10.1; 307/9.1

(58) Field of Classification Search
CPC ............... H05K 7/00; B60L 1/00; H02G 3/00
USPC .................................................. 307/9.1, 10.1
See application file for complete search history.

(56) References Cited

U.S. PATENT DOCUMENTS

2009/0107694 A1    4/2009    Watanabe

FOREIGN PATENT DOCUMENTS

| DE | 102005054926 A1 | 6/2006 |
| JP | 2006312409 A | 11/2006 |
| RU | 2291067 C2 | 1/2007 |

*Primary Examiner* — Hal Kaplan
(74) *Attorney, Agent, or Firm* — Gifford, Krass, Sprinkle, Anderson & Citkowski, P.C.

(57) ABSTRACT

A system for reducing electromagnetic noise generated by common mode currents in electrical connections of a power inverter and battery in an electric or hybrid electric vehicle. A pair of spaced apart electrical conductors extends along the vehicle chassis and electrically connects the power inverter to the battery. An electrically conductive metal plate is positioned in between the spaced apart electrical conductors. This metal plate is electrically connected to the chassis adjacent at least both of the power inverter and the battery/motor. Besides this, more connecting points are required to keep the distance between two points less than half wavelength of the maximum frequency of EMI requirements, and most preferably this metal plate is electrically connected to the chassis all the way with infinite connecting points. The metal plate is positioned so that the metal plate is closer to the electrical conductors than the space in between the electrical conductors and the vehicle chassis.

13 Claims, 2 Drawing Sheets

SYSTEM FOR POWER TRANSMISSION

BACKGROUND OF THE INVENTION

I. Field of the Invention

The present invention relates generally to a power transmission system with reduced electromagnetic interference and, more particularly, to the power transmission between a power inverter and a battery in an electric or hybrid electric automotive vehicle.

II. Description of Related Art

New developments and advancements in the automotive industry are primarily driven by new and improved electronic components in the automotive vehicles. These new developments include, for example, vehicle navigation systems, infotainment equipment, safety equipment, and the like.

In order to ensure the functionality of the increasingly complex electronic systems in automotive vehicles and also to minimize the negative impacts of the automotive system on external systems, electromagnetic capability (EMC) has become an increasing concern for the automotive vehicles. This is particularly true in hybrid electric vehicles and electric vehicles where high voltage and high current switching is required in order to power the vehicle.

In particular, hybrid electric vehicles and electric vehicles (hereinafter collectively referred to as "electric vehicles") typically use a power inverter which switches high current and voltage and provides the necessary power outputs to the electric motor or motors utilized to propel the vehicle. In order to supply the electrical power to the power inverter for ultimate distribution to the electric vehicle motor or motors, the electric vehicle includes a high capacity electric battery.

Conventionally, a pair of elongated conductors is used to electrically connect the battery to the power inverter in an electric vehicle. The electric battery is usually spaced from the power inverter so that the electrical conductors between the power inverter and the battery extend along the electrically conductive vehicle chassis.

Due to impedance mismatching of the electrical conductors and their connection with both the power inverter and the battery, common mode electric currents are generated along both conductors. These common mode electric currents, in turn, generate electromagnetic interference (EMI) which may interfere with the electrical components of the vehicle electrical system. For example, the common mode electrical currents generated on the electrical conductors between the power inverter and the battery are known to generate electrical noise which interferes with the electrical system of other electrical components of the vehicle, such as the radio or other infotainment device. As such, the reduction of electrical noise from these common mode currents has become a high priority in the design of electrical systems for automotive vehicles and especially electric vehicles where the generation of EMI is inherently more challenging than nonelectric automotive vehicles.

SUMMARY OF THE PRESENT INVENTION

The present invention provides a system for reducing electromagnetic noise generated by common mode currents in the electrical connection of a spaced apart power source and load such as the battery and inverter in an electric automotive vehicle.

The system includes a pair of spaced apart electrical conductors. These electrical conductors extend along the vehicle chassis between the power source and load or the battery and the power inverter. The electrical conductors are electrically connected to both the power source and the load thus electrically connecting them together. Furthermore, the power source and load may comprise the battery and power inverter in the electric vehicle.

An electrically conductive metal plate is positioned in between the spaced apart electrical conductors. This metal plate is electrically connected to the vehicle chassis at least at both the power source and the load. Besides this, more connecting points are required to keep the distance between two points less than half wavelength of the maximum frequency of EMI requirements, and most preferably this metal plate is electrically connected to the chassis all the way with infinite connecting points. Furthermore, the conductors are arranged so that the spacing between the conductors and the metal plate is less than the spacing between the conductors and the vehicle chassis. Conductors are symmetrically distributed on two sides of the metal plate. In doing so, the return current is changed from the chassis to the metal plate, and two current loops made by each electrical conductor and metal plate can generate opposite magnetic fields, therefore they are cancelled by each other, thus reducing the total electromagnetic interference.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
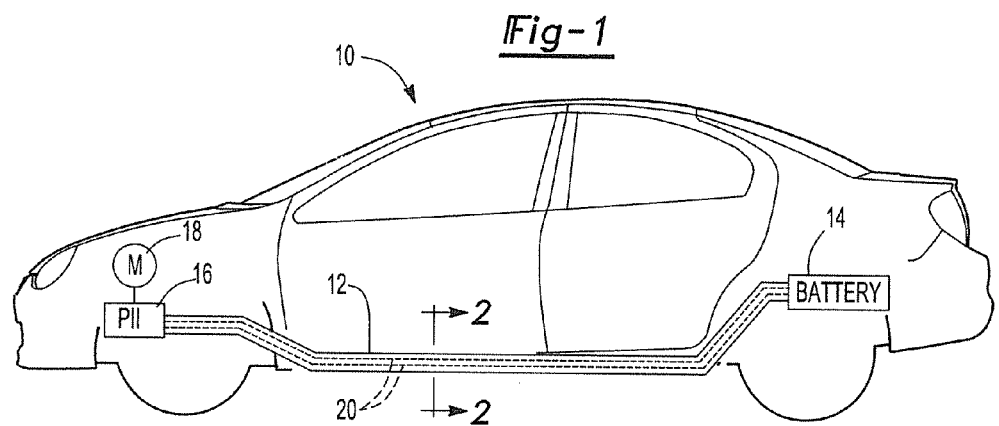
FIG. 1 is a diagrammatic view illustrating an electric vehicle.

With reference first to FIG. 1, an electric automotive vehicle 10 is illustrated diagrammatically. In a conventional fashion, the automotive vehicle 10 includes a chassis 12 constructed of an electrically conductive material, such as steel. That automotive chassis 12, furthermore, forms the ground plane for the automotive vehicle.

A battery 14 is contained in or supported by the chassis 12. Similarly, a power inverter 16 is contained within or supported by the chassis 12. The power inverter 16 provides electrical power to an electric motor 18 which is drivingly connected to one or more of the vehicle wheels.

Figure 2:
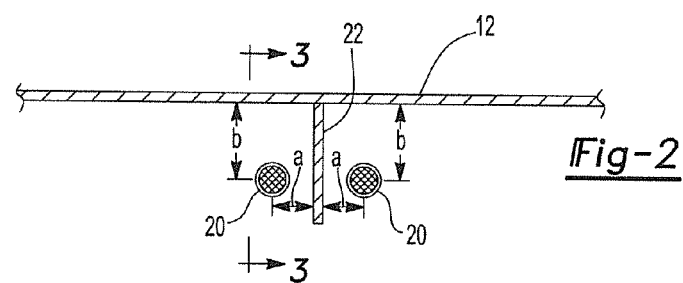
FIG. 2 is a diagrammatic sectional view taken along line 2-2 in FIG. 1 and enlarged for clarity.
Figure 6:
FIG. 6 is the diagrammatic sectional view taken along line 2-2 in FIG. 1 but for conventional cable routing without the metal plate.
Figure 6:
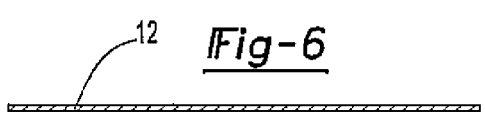

With reference now to FIGS. 1 and 2, a pair of spaced apart electrical conductors 20 extends along the vehicle chassis 12 and electrically connects the battery 14 to the power inverter 16. Any conventional means may be utilized to electrically connect the conductors 20 to both the power inverter 16 and the battery 14 with reference to FIG. 6.

As best shown in FIG. 2, the electrical conductors 20 are spaced apart and generally parallel to each other in their extent from the battery 14 to the power inverter 16. Furthermore, the conductors 20 are spaced from the chassis 12 by a distance b.

Since it is extremely difficult, if not altogether impossible, to obtain a perfect impedance match between the electrical connections of the electrical conductors 20 and the battery 14 and power inverter 16, common mode currents will inherently occur along the conductors 20 during the operation of the electric vehicle 10. It is these common mode currents which result in EMI and potential interference with the other electronic and electrical systems of the automotive vehicle 10.

In order to reduce the generation of EMI by the common mode currents, a generally planar metal plate 22 constructed of an electrically conductive material is positioned in between the electrical conductors 20, with reference to FIG. 2. This metal plate 22, furthermore, is preferably positioned so that the electrical conductors 20 are spaced apart from the metal plate by an equal distance a. The distance a, furthermore, is preferably less than the distance b so that the electromagnetic field generated by common mode currents in the conductors 20 will induce more current flow in the metal plate 22 than in the chassis 12.

Figure 3A:
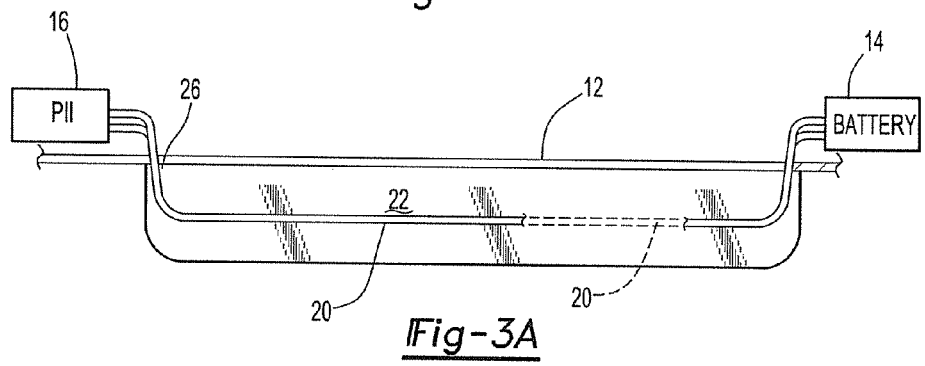
FIG. 3A is a diagrammatic side view illustrating a preferred embodiment of the present invention.
Figure 3B:
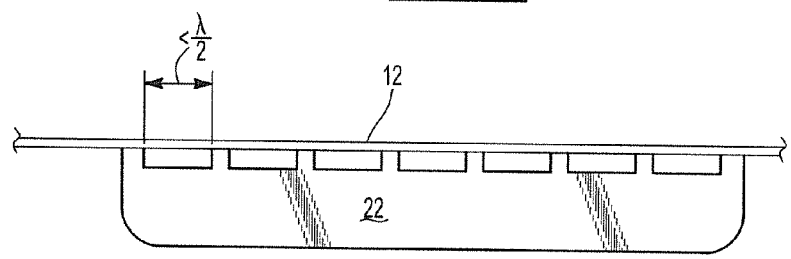
FIG. 3B is a view similar to FIG. 3A, but illustrating a modification.

With reference to FIG. 3A, the most preferable configuration is to electrically connect the metal plate to the chassis all the way. If only finite connecting points are allowed between the metal plate and chassis, this metal plate is electrically connected to the vehicle chassis at least at both the power source and the load as shown in FIG. 3B. Besides this, more connecting points are required to keep the distance between two adjacent points less than half wavelength of selected maximum frequencies of EMI requirements to avoid resonance of the metal plate.

Figure 4:
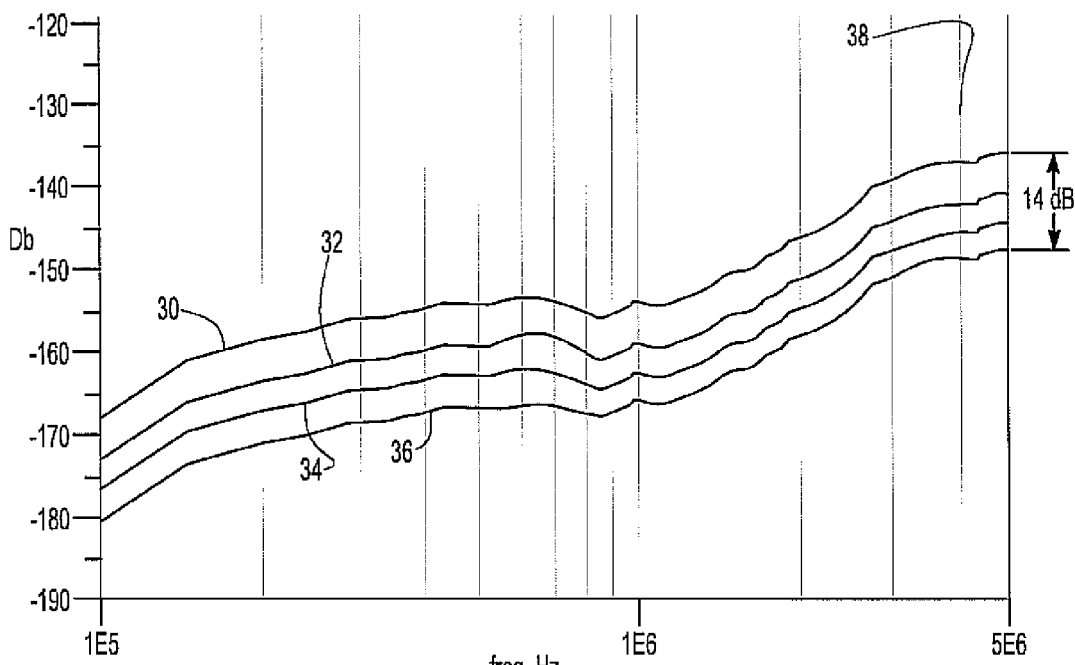
FIG. 4 is a graph illustrating the EMI reduction in accordance with the present invention.

As best shown in FIG. 4, the electric metal plate 22 is electrically connected to the chassis 12. By thus the return path of the common mode current is changed from the chassis 12 to the metal plate 22. Thus, in turn, two current loops made by each electrical conductor and metal plate can generate opposite magnetic fields, therefore they are cancelled by each other, thus reducing the total electromagnetic interference.

With reference now to FIG. 4, a graph illustrating the effect of the metal plate 22 is illustrated as a function of noise on the Y axis versus frequency on the X axis. Graph 30 illustrates the generation of noise for the conventional prior art vehicles, i.e. vehicles without the metal plate 22. Graph 32 illustrates noise as a function of frequency with the metal plate installed but where the distance a is greater than the distance b.

Similarly, graph 34 illustrates the generation of noise as a function of frequency where the distance a equals the distance b while graph 36 illustrates the generation of noise as a function of frequency where the distance a is less than the distance b.

As becomes clear from the graphs 30-36 illustrated in FIG. 4, the provision of the metal plate 22 and with the distance a, i.e. the spacing between the conductors and the metal plate 22 being less than the spacing b, i.e. the distance between the conductors 20 and chassis 12, provides the greatest reduction of EMI for the vehicle. Indeed, this reduction is as high as 14 dB as shown at 38.

Figure 5A:
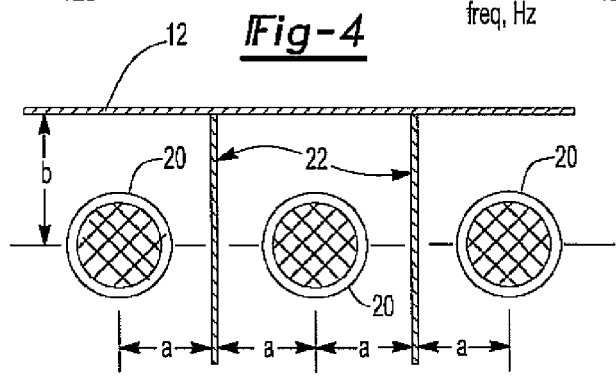
FIGS. 5A and 5B are other examples of embodiments of the invention with 3-phase motor cables.
Figure 5B:
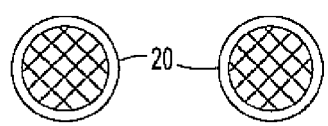

Previously the idea for high voltage DC cable. The same idea can be applied to 3-phase AC cables with reference to FIG. 6. Metal plate is needed to be placed between cables as shown in FIGS. 5A and 5B.

From the foregoing, it can be seen that the present invention provides a simple, yet effective, means for reducing EMI in an electric automotive vehicle. Having described our invention, however, many modifications thereto will become apparent to those skilled in the art to which it pertains without deviation from the spirit of the invention as defined by the scope of the appended claims.

We claim:

1. An electrical power transmission system for transmitting power between a power source and a load spaced from the power source, said power source and said load mounted in a housing, said system comprising:
a pair of spaced apart electrical conductors extending along the housing between and electrically connecting the power source to the load,
an electrically conductive metal plate positioned between said spaced apart electrical conductors, said metal plate being electrically connected to the housing adjacent at least both ends of the metal plate between the power source and the load, said plate being electrically connected to said housing by spaced connecting points in which a distance between adjacent points is less than the half of the smallest wavelength among selected frequencies.

2. The system as defined in claim 1 wherein said metal plate is electrically connected to said housing continuously along its length.

3. The system as defined in claim 1 wherein the housing comprises a chassis of an automotive vehicle.

4. The system as defined in claim 3 wherein the automotive vehicle comprises an electric vehicle or a hybrid electric vehicle.

5. The system as defined in claim 4 wherein the load comprises a power inverter and the power source comprises a storage battery.

6. The system as defined in claim 1 wherein said electrical conductors are spaced from the housing by a distance greater than the spacing between said electrical conductors and said metal plate.

7. The system as defined in claim 6 wherein said electrical conductors are equidistantly spaced from said metal plate.

8. The system as defined in claim 1 wherein said metal plate is planar in shape.

9. A system for reducing electromagnetic noise generated by common mode currents in the electrical connection of a spaced apart power inverter and battery in an electric or hybrid electric automotive vehicle having an electrically conductive chassis, said system comprising:
a pair of spaced apart electrical conductors extending along the chassis between and electrically connecting the power inverter to the battery/motor,
an electrically conductive metal plate positioned between said spaced apart electrical conductors, said metal plate being electrically connected to the chassis adjacent at least both ends of the metal plate between the power inverter and the battery,
an electrically conductive metal plate positioned between said spaced apart electrical conductors, said metal plate being electrically connected to the chassis between the power inverter and the battery with finite connecting points wherein a distance between adjacent points is less than the half of the smallest wavelength among selected frequencies.

10. The system as defined in claim 9 wherein said metal plate is continuously electrically connected to said chassis along its length.

11. The system as defined in claim 9 wherein said electrical conductors are spaced from the chassis by a distance greater than the spacing between said electrical conductors and said metal plate.

12. The system as defined in claim 11 wherein said electrical conductors are equidistantly spaced from said metal plate.

13. The system as defined in claim 9 wherein said metal plate is planar in shape.

\* \* \* \* \*